US010886073B2

(12) United States Patent
Awad et al.

(10) Patent No.: US 10,886,073 B2
(45) Date of Patent: Jan. 5, 2021

(54) FLEXIBLE SOLAR PANEL

(71) Applicant: KING SAUD UNIVERSITY, Riyadh (SA)

(72) Inventors: Manal Ahmed Gasmelseed Awad, Riyadh (SA); Awatif Ahmed Hendi, Riyadh (SA); Khalid Mustafa Osman Ortashi, Riyadh (SA)

(73) Assignee: KING SAUD UNIVERSITY, Riyadh (SA)

( * ) Notice: Subject to any disclaimer, the term of this patent is extended or adjusted under 35 U.S.C. 154(b) by 278 days.

(21) Appl. No.: 15/098,242

(22) Filed: Apr. 13, 2016

(65) Prior Publication Data
US 2017/0301482 A1    Oct. 19, 2017

(51) Int. Cl.
*H01L 31/00* (2006.01)
*H01G 9/20* (2006.01)
*H01L 51/00* (2006.01)

(52) U.S. Cl.
CPC .......... *H01G 9/2059* (2013.01); *H01G 9/204* (2013.01); *H01G 9/2031* (2013.01); *H01G 9/2095* (2013.01); *H01L 51/0093* (2013.01); *H01L 51/0097* (2013.01)

(58) Field of Classification Search
USPC ...................................................... 136/263
See application file for complete search history.

(56) References Cited

U.S. PATENT DOCUMENTS

| 4,989,956 | A | 2/1991 | Wu et al. | |
| 6,018,124 | A * | 1/2000 | Lidow ................. | H01L 31/0224 136/252 |
| 2008/0245411 | A1 | 10/2008 | Hammermann et al. | |
| 2010/0193010 | A1 | 8/2010 | Wells | |
| 2011/0220205 | A1* | 9/2011 | Jang ...................... | H01G 9/2031 136/263 |
| 2012/0125439 | A1* | 5/2012 | Calogero ............... | B82Y 10/00 136/263 |
| 2014/0313574 | A1* | 10/2014 | Bills ........................ | B05D 1/02 359/359 |
| 2015/0295100 | A1 | 10/2015 | Chen et al. | |

FOREIGN PATENT DOCUMENTS

WO    WO 2014/182589 A1    11/2014

OTHER PUBLICATIONS

Pavoković, D. et al, "Complex Biochemistry and Biotechnological Production of Betalains", Food Technology Biotechnology, vol. 49, No. 2, p. 145-155, (2011).*
Sengupta, D. et al, "Visible light absorption and photo-sensitizing properties of spinach leaves and beetroot extracted natural dyes". Spectrochimica Acta Part A: Molecular and Biomolecular Spectroscopy. vol. 148 p. 85-92 (2015).*
Ninfali, Paolino et al. "Nutritional and functional potential of Beta vulgaris cicla and rubra." Fitoterapia vol. 89 p. 188-199 (2013).*
Syafinar, R. et al.,"Chlorophyll Pigments as Nature Based Dye for Dye-Sensitized Solar Cell (DSSC)", Energy Procedia, vol. 79, p. 896-902 (2015).*
Han et al., "Study on the constitution and photoelectrochemical character of chlorophyll cells," J. Photochem. Photobiol. A: Chem., 76, pp. 167-169 (1993) (Year: 1993).*
Van Zandvoort et al., "Chlorophylls in Polymers. I. State of Chlorophyll a in Unstretched Polymer Systems," Photochem. Photobiol., vol. 62, pp. 279-289 (1995) (Year: 1995).*
Han et al., "Electrical characteristics of chlorophyll-a polyvinyl alcohol photovoltaic cells," Chinese J. of Chem., vol. 18(3), p. 309-314 (2000) (Year: 2000).*
Ochiai et al., "Immobilization of Chloroplast Photosystems with Polyvinyl Alcohols," Agric. Biol. Chem., vol. 42(3), pp. 683-685 (1978) (Year: 1978).*
Ochiai et al., "Immobilization of Chloroplast Photosystems within Polyacrylamide Gel Formed by the Redox Polymerization," Nippon Nogeikagaku Kaishi, 52, 31 (1978) (Year: 1978).*
Ochiai et al., "Photocurrent by Immobilized Chloroplast Film Electrode," Agric. Biol. Chem., 43 (4), 881-883 (1979) (Year: 1979).*
Yang et al., "Preparation of Photostable Chlorophyll/PVA Film," Adv. Mat. Res., vols. 239-242, pp. 2707-2710 (2011) (Year: 2011).*
Pavokovic et al, "Complex Biochemistry and Biotechnological Production of Betalains," Food Technol. Biotechnol. 49 (2) 145-155 (2011) (Year: 2011).*
Wong et al., "Excitation Energy Transfer among Chlorophyll a Molecules in Polystyrene: Concentration Dependence of Quantum Yield, Polarization and Lifetime of Fluorescence," Z. Naturforsch. 33c, 863-869 (1978) (Year: 1978).*
Calogero et al., "Anthocyanins and Betalains as Light-Harvesting Pigments for Dye-Sensitized Solar Cells," Solar Energy 86 (2012) 1563-1575 (Year: 2012).*
Hernández-Martínez et al., "Stabilized Conversion Efficiency and Dye-Sensitized Solar cells from Beta vulgaris Pigment," Int. J. Mol. Sci. 2013, 14, 4081-4093; doi:10.3390/ijms14024081 (Year: 2013).*
Bakry et al., "Utilization of Swiss Chard as Functional Food," Nature and Science 2014;12(12) (Year: 2014).*
PTAB Decision in related U.S. Appl. No. 15/097,264. (Year: 2020).*
Rahman et al., "Interference Pigment Coated Solar Cells for Use in High Radiant Flux Environments," Jordan Journal of Mechanical and Industrial Engineering, Jan. 2010, vol. 4, pp. 129-134.
Azhari et al., "Fabrication of Low Cost Sensitized Solar Cell Using Natural Plant Pigment dyes," Journal of Engineering and Applied Sciences, Sep. 2015, vol. 10, pp. 7092-7096.

(Continued)

*Primary Examiner* — Angelo Trivisonno
(74) *Attorney, Agent, or Firm* — Nath, Goldberg & Meyer; Richard C. Litman

(57) ABSTRACT

The flexible solar panel includes a polymer matrix and a plant extract incorporated in the polymer matrix. The plant extract can be an extract of chard (*B. vulgaris* subsp. *cicla*) including an organic dye. The plant extract can include chloroplasts. The polymer matrix may be formed from either poly(vinyl alcohol) or polystyrene. The flexible solar panel can be green.

3 Claims, No Drawings

(56) References Cited

OTHER PUBLICATIONS

Summoogum-Utchanah et al., "An investigation on the potential of extracting natural dyes from beetroot and turmeric," International Journal of Research in Engineering and Technology, Feb. 2015, vol. 4, pp. 401-416.

* cited by examiner

FLEXIBLE SOLAR PANEL

BACKGROUND OF THE INVENTION

1. Field of the Invention

The present invention relates to solar cells, solar panels and the like, and particularly to a flexible solar panel including an extract of chard (*B. vulgaris* subsp. *cicla*).

2. Description of the Related Art

A dye-sensitized solar cell is a type of thin film solar cell. The dye-sensitized solar cell has a number of attractive features, such as its relatively easy and low-cost manufacture, typically by conventional roll-printing techniques. However, in the manufacture of dye-sensitized solar cells, it has proven difficult to eliminate or reduce a number of expensive materials, notably platinum and ruthenium. Thus, a flexible solar panel solving the aforementioned problems is desired.

SUMMARY OF THE INVENTION

The flexible solar panel includes a polymer matrix and a plant extract incorporated in the polymer matrix. The plant extract can be an extract of chard (*B. vulgaris* subsp. *cicla*). The plant extract can include chloroplasts. The polymer matrix may be formed from either poly(vinyl alcohol) or polystyrene.

These and other features of the present invention will become readily apparent upon further review of the following specification.

DETAILED DESCRIPTION OF THE PREFERRED EMBODIMENTS

The flexible solar panel includes a polymer matrix and a plant extract incorporated in the polymer matrix. The plant extract can include chloroplasts. The plant extract can include an organic dye or an organic chromophore. The plant extract can be an extract of chard (*B. vulgaris* subsp. *cicla*). The polymer matrix may be formed from either poly(vinyl alcohol) or polystyrene.

In order to make the flexible solar panel, a green colored extract of *B. vulgaris* subsp. *cicla* is first prepared. A polystyrene (PS) solution, e.g., polystyrene dissolved in toluene, can then be mixed with the extract of *B. vulgaris* subsp. *cicla*. The mixture can then be allowed to dry to produce a flexible green colored sheet, or solar panel. For example, the mixture can be disposed on a glass plate at room temperature for about 48 hours and then removed from the plate.

Alternatively, polyvinyl alcohol (PVA), instead of the polystyrene solution (PS), may be added to a first amount of *B. vulgaris* subsp. *cicla* extract until completely dissolved to form a first mixture. Then, a second amount of the *B. vulgaris* subsp. *cicla* extract is added to the mixture to produce a second mixture. The mixture can then be allowed to dry to produce a flexible green colored sheet, or solar panel. For example, the mixture can be disposed on a glass plate at room temperature for about 48 hours and then removed from the plate.

These and other features of the present invention will become readily apparent upon further review of the following specification and drawings.

Example 1

A green extract of the *B. vulgaris* subsp. *cicla* was prepared by washing half of a conventional sized bag of *B. vulgaris* subsp. *cicla* leaves, and then blending the leaves in approximately 200 mL of water. The leaves were ground in the water for between 5 and 10 minutes until the leaves were thoroughly blended. The blended leaves in the water were then centrifuged at 9,000 rpm for 10 minutes to produce the green colored *B. vulgaris* subsp. *cicla* extract.

The flexible solar panel was then made by dissolving 3 grams of poly(vinyl alcohol) in 30-50 mL of the *B. vulgaris* subsp. *cicla* dye under vigorous stirring at 60° C. to form a first solution. Stirring was performed until the poly(vinyl alcohol) (PVA) was completely dissolved in the *B. vulgaris* subsp. *cicla* dye. An additional 10-30 mL of the *B. vulgaris* subsp. *cicla* dye was then added to the first solution, until completely mixed, to form a second solution. The second solution was then coated on a glass plate. The second solution was dried on the plate at room temperature for 48 hours to form a flexible green film, which was then removed from the plate. The flexible green film removed from the plate formed the flexible solar panel.

Solar panels produced by the above method were exposed to light from a 12 volt lamp (emitting a mean intensity of 700 lux) and then tested for current generation and the values of the voltage using a microvolt digital multimeter, such as the Model 177 Microvolt DMM, manufactured by Keithley Instruments, Inc. of Cleveland, Ohio. Under illumination, the solar panels were found to generate a voltage of −22.9 mV and current of −0.2935897 mA. In the absence of light, the multimeter measured a voltage of approximately −44.6 mV and a current of approximately −0.3811966 mA, thus showing a clear increase of current and voltage generation upon exposure to light.

A control panel, formed without the *B. vulgaris* subsp. *cicla* dye, produced zero current or potential difference in the presence of light. Thus, the observed current generation and induced potential difference of the green flexible solar film is due to the presence of chloroplasts in the *B. vulgaris* subsp. *cicla* extract, rather than any other conventional electron motive force generating factor.

Example 2

A green extract of the *B. vulgaris* subsp. *cicla* was prepared by washing half of a conventional sized bag of *B. vulgaris* subsp. *cicla* leaves, and then blending the leaves in approximately 200 mL of ethanol. The leaves were ground in the ethanol for between 5 and 10 minutes until the leaves were thoroughly blended. The blended leaves in the ethanol were then centrifuged at 9,000 rpm for 10 minutes to produce the *B. vulgaris* subsp. *cicla* extract. The *B. vulgaris* subsp. *cicla* chromophore extract was green in color.

The flexible solar panel was then made by dissolving 4 grams of polystyrene in 30-60 mL of toluene under vigorous stirring at 60° C. to form a first solution. Stirring was performed until the polystyrene (PS) was completely dissolved in the toluene. 30-50 mL of the *B. vulgaris* subsp. *cicla* extract was added to the first solution, until completely mixed, to form a second solution. The second solution was then coated on a glass plate. The second solution was dried on the plate at room temperature for 48 hours to form a flexible green film, which was then removed from the plate. The flexible green film removed from the plate formed the flexible solar panel.

Solar panels produced by the above method were exposed to light from a 12 volt lamp (emitting a mean intensity of 700 lux) and then tested for current generation and the values of the voltage using a microvolt digital multimeter, such as the Model 177 Microvolt DMM, manufactured by Keithley Instruments, Inc. of Cleveland, Ohio. Under illumination, the solar panels were found to generate a voltage of −27.1 mV and current of −0.14 mA. In the absence of light, the multimeter measured a voltage of approximately −42.5 mV and a current of approximately −0.21 mA, thus showing a clear increase of current and voltage generation upon exposure to light.

Example 3

In a third example, silver nanoparticles, zinc oxide nanoparticles and titanium dioxide nanoparticles were each added separately to the poly(vinyl alcohol) and the *B. vulgaris* subsp. *cicla* extract solution, and the solutions were cast on glass plates to dry at room temperature. Each solar panel was tested in a manner similar to that described above for Examples 1 and 2; i.e., the solar panels produced by the above method were exposed to light from a 12 volt lamp (emitting a mean intensity of 700 lux) and then tested for current generation and the values of the voltage using a microvolt digital multimeter, such as the Model 177 Microvolt DMM, manufactured by Keithley Instruments, Inc. of Cleveland, Ohio.

Under illumination, the solar panels produced with just the silver nanoparticles were found to generate a voltage of −59 mV and a current of −0.124 mA. In the absence of light, the multimeter measured a voltage of approximately −106 mV and a current of approximately −0.223 mA, thus showing a clear increase of current and voltage generation upon exposure to light. For the solar panels produced with only zinc oxide nanoparticles, the solar panels were found to generate a voltage of −19.8 mV and a current of −0.099 mA under illumination. In the absence of light, the multimeter measured a voltage of approximately −61.4 mV and a current of approximately −0.2193 mA, thus showing a clear increase of current and voltage generation upon exposure to light. Similarly, for the solar panels produced with only titanium dioxide nanoparticles, under illumination, the solar panels were found to generate a voltage of −16 mV and a current of −0.213 mA. In the absence of light, the multimeter measured a voltage of approximately −32.4 mV and a current of approximately −0.85 mA, thus showing a clear increase of current and voltage generation upon exposure to light.

It is to be understood that the present invention is not limited to the embodiments described above, but encompasses any and all embodiments within the scope of the following claims.

We claim:

1. A flexible solar panel, comprising a polymer matrix and a plant extract completely incorporated in the polymer matrix, the plant extract being a green-colored extract of *B. vulgaris* subsp. *cicla*, wherein the extract includes chloroplasts.

2. The flexible solar panel as recited in claim 1, wherein said polymer matrix comprises poly(vinyl alcohol).

3. The flexible solar panel as recited in claim 1, wherein said polymer matrix comprises polystyrene.

* * * * *